(12) United States Patent
Hu et al.

(10) Patent No.: US 11,916,102 B2
(45) Date of Patent: Feb. 27, 2024

(54) DOUBLE-SIDED CAPACITOR STRUCTURES AND FORMING METHODS THEREOF

(71) Applicant: CHANGXIN MEMORY TECHNOLOGIES, INC., Anhui (CN)

(72) Inventors: Wenjia Hu, Hefei (CN); Han Wu, Hefei (CN); Yong Lu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 437 days.

(21) Appl. No.: 17/310,899

(22) PCT Filed: Mar. 8, 2021

(86) PCT No.: PCT/CN2021/079544
§ 371 (c)(1),
(2) Date: Aug. 28, 2021

(87) PCT Pub. No.: WO2021/185108
PCT Pub. Date: Sep. 23, 2021

(65) Prior Publication Data
US 2022/0320267 A1     Oct. 6, 2022

(30) Foreign Application Priority Data
Mar. 20, 2020   (CN) .......................... 202010199381.6

(51) Int. Cl.
*H01L 23/522*     (2006.01)
*H01L 23/64*      (2006.01)
(Continued)

(52) U.S. Cl.
CPC .............. *H01L 28/91* (2013.01); *H01L 28/75* (2013.01); *H01L 28/92* (2013.01)

(58) Field of Classification Search
CPC ......... H01L 28/75; H01L 28/91; H01L 28/92; H01L 23/64; H01L 23/5223; H10B 12/00; H10B 12/03; H10B 12/30; Y02E 60/13
See application file for complete search history.

(56) References Cited

U.S. PATENT DOCUMENTS

2001/0053576 A1*  12/2001  DeBoer ................... H01L 28/91
                                                                257/E27.087
2013/0249053 A1*  9/2013  Lee .......................... H01L 28/40
                                                                      257/532
(Continued)

FOREIGN PATENT DOCUMENTS

| CN | 107393909 A | 11/2017 |
|---|---|---|
| CN | 208336219 U | 1/2019 |
| JP | 2001127269 A | 5/2001 |

OTHER PUBLICATIONS

International Search Report in Application No. PCT/CN2021/079544 dated Jun. 8, 2021.

*Primary Examiner* — Omar F Mojaddedi
(74) *Attorney, Agent, or Firm* — Syncoda LLC; Feng Ma

(57) ABSTRACT

A method for forming a double-sided capacitor structure includes: providing a base, the base including a substrate, a plurality of capacitor contacts located in the substrate, a stack structure located on a surface of the substrate and a plurality of capacitor holes running through the stack structure and exposing the capacitor contacts, the stack structure including sacrificial layers and support layers which are stacked alternately; successively forming a first electrode layer, a first dielectric layer and a second electrode layer on inner walls of the capacitor holes; forming a first conductive filling layer in the capacitor holes; forming an auxiliary layer for sealing the capacitor holes; removing a part of the auxiliary layers and several of the support layers and the (Continued)

sacrificial layers to expose the first electrode layer; and, forming a second dielectric layer and a third electrode layer.

12 Claims, 8 Drawing Sheets

(51) Int. Cl.
  *H10B 12/00* (2023.01)
  *H01L 49/02* (2006.01)

(56) References Cited

U.S. PATENT DOCUMENTS

| | | | |
|---|---|---|---|
| 2018/0175041 A1* | 6/2018 | Kim | H01L 28/87 |
| 2019/0035880 A1* | 1/2019 | Voiron | H01L 28/91 |
| 2019/0074349 A1* | 3/2019 | Lin | H01L 23/562 |
| 2019/0348417 A1* | 11/2019 | Yokoyama | H10B 12/033 |
| 2020/0058654 A1* | 2/2020 | Yang | H10B 12/315 |
| 2020/0058732 A1* | 2/2020 | Lu | H01L 28/92 |
| 2021/0183873 A1* | 6/2021 | Goodwin | H10B 12/05 |
| 2022/0199759 A1* | 6/2022 | Chyi Liu | H01L 28/75 |

\* cited by examiner

S11 — Provided a base, the base comprising a substrate, a plurality of capacitoR contacts located in the substrate, a stack structure located on a surface of the substrate and a plurality of capacitor holes which run through the stack structure and expose the capacitor contacts, the stack structure comprising sacrificial layers and support layers, which are stacked alternately in a direction perpendicular to the substrate

S12 — Successively form, on inner walls of the capacitor holes, a first electrode layer, a first dielectric layer and a second electrode layer which are superimposed in a radial direction of the capacitor holes

S13 — Fill a first conductive material in the capacitor holes to form a first conductive filling layer

S14 — Form an auxiliary layer for sealing the capacitor holes

S15 — Remove a part of the auxiliary layer and several of the support layers and the sacrificial layers to expose the first electrode layer, the remaining of the auxiliary layer being divided into a plurality of sub-auxiliary layers, each of which being at least overlapped with two capacitor holes

S16 — forming a second dielectric layer covering a surface of the first electrode layer and surfaces of the sub-auxiliary layers and a third electrode layer covering a surface of the second dielectric layer to form a double-sided capacitor structure

FIG. 1

DOUBLE-SIDED CAPACITOR STRUCTURES AND FORMING METHODS THEREOF

CROSS-REFERENCE TO RELATED APPLICATIONS

This application is a national stage of International Application No. PCT/CN2021/079544 filed on Mar. 8, 2021, which claims priority to Chinese Patent Application No. 202010199381.6 filed on Mar. 20, 2020. The disclosures of these applications are hereby incorporated by reference in their entirety.

TECHNICAL FIELD

The present disclosure relates to the technical field of semiconductor manufacturing, and in particular to a double-sided capacitor structure and a forming method thereof.

BACKGROUND

Dynamic random-access memories (DRAMs), as semiconductor structures commonly used in electronic devices such as computers, are composed of a plurality of storage units, each of which usually comprises a transistor and a capacitor. Gates of the transistors are electrically connected to word lines, sources thereof are electrically connected to bit lines, and drains thereof are electrically connected to the capacitors. The word line voltage on the word lines can control the on or off of the transistors, so that data information stored in the capacitors can be read or data information can be written into the capacitors by using the word lines.

With the miniaturization of the semiconductor device, the lateral area of the semiconductor device on the substrate decreases. In order to improve or maintain a capacitor to have an enough high capacitance value, the height of bottom electrodes can be increased or the thickness of bottom electrodes can be decreased. However, by increasing the height of the bottom electrodes or decreasing the thickness of the bottom electrodes, the bottom electrodes will have a length-to-diameter ratio and a smaller thickness, thereby affecting the performance reliability of the capacitor array region. For example, the collapse or overturning of the bottom electrodes will be caused, and the short circuit of adjacent bottom electrodes is thus caused.

In order to solve this problem, it is possible to additionally provide continuous lateral support layers of the electrodes so as to improve the stability of the electrodes. However, a single lateral support layer has a height limit, so the capacitance value of the capacitor is limited by the height of the electrodes, and there is still a risk of electrode overturning and collapse.

Therefore, how to solve the problem of lateral instability of the capacitor array region, reduce the risk of collapse or overturning of bottom electrodes and improve the performance stability of semiconductor devices is a technical problem to be urgently solved at present.

SUMMARY

The present disclosure provides a double-sided capacitor structure and a forming method thereof, in order to solve the problem of low lateral stability of a capacitor array region and improve the performance stability of semiconductor devices.

In order to solve the problem mentioned above, the present disclosure provides a method for forming a double-sided capacitor structure, comprising:

providing a base, the base comprising a substrate, a plurality of capacitor contacts located in the substrate, a stack structure located on a surface of the substrate and a plurality of capacitor holes running through the stack structure and exposing the capacitor contacts, the stack structure comprising sacrificial layers and support layers, the sacrificial layers and the support layers stacked alternately in a direction perpendicular to the substrate;

successively forming, on inner walls of the capacitor holes, a first electrode layer, a first dielectric layer and a second electrode layer stacked along a radial direction of the capacitor holes;

filling a first conductive material in the capacitor holes to form a first conductive filling layer;

forming an auxiliary layer for sealing the capacitor holes;

removing a part of the auxiliary layer and several of the support layers and the sacrificial layers to expose the first electrode layer, a remaining of the auxiliary layer being divided into a plurality of sub-auxiliary layers, each of the sub-auxiliary layers being at least overlapped with two capacitor holes; and forming a second dielectric layer covering a surface of the first electrode layer and surfaces of the sub-auxiliary layers and a third electrode layer covering a surface of the second dielectric layer to form a double-sided capacitor structure.

Optionally, the first electrode layer, the first dielectric layer and the second electrode layer are also successively stacked on a top surface of the stack structure, and the forming a first conductive filling layer comprises:

depositing the first conductive material in the capacitor holes and on a surface of the second electrode layer located on the top surface of the stack structure; and removing the first conductive material covering the surface of the second electrode layer on the top surface of the stack structure.

Optionally, the forming an auxiliary layer for sealing the capacitor holes comprises:

removing the first electrode layer, the first dielectric layer and the second electrode layer covering the top surface of the stack structure; and forming an auxiliary layer covering the second electrode layer on the top surface of the stack structure and sealing the capacitor holes.

Optionally, the stack structure comprises a first support layer, a first sacrificial layer, a second support layer, a second sacrificial layer and a third support layer successively stacked along a direction perpendicular to the substrate; and, the removing a part of the auxiliary layer and several of the support layers and the sacrificial layers comprises:

forming a photoresist layer covering the auxiliary layer, the photoresist layer having an etching window for exposing the auxiliary layer; and successively etching the auxiliary layer, the third support layer, the second sacrificial layer, the second support layer and the first sacrificial layer along the etching window, so that a remaining of the auxiliary layer is divided into a plurality of sub-auxiliary layers, each of the sub-auxiliary layers being overlapped with two capacitor holes.

Optionally, a material of the auxiliary layer is the same as a material of the support layers.

Optionally, after forming a double-sided capacitor structure, the method further comprises:

depositing a second conductive material on a surface of the third electrode layer to form a second conductive filling layer.

In order to solve the problem mentioned above, the present disclosure further provides a double-sided capacitor structure, comprising:

a base, the base comprising a substrate, a plurality of capacitor contacts located in the substrate, a stack structure located on a surface of the substrate and a plurality of capacitor holes running through the stack structure and exposing the capacitor contacts, the stack structure at least comprising a plurality of support layers stacked along a direction perpendicular to the substrate;

a first electrode layer, covering inner walls of the capacitor holes;

a first dielectric layer, covering sidewall surfaces and bottom wall surfaces of the first electrode layer facing the capacitor holes;

a second electrode layer, covering sidewall surfaces and bottom wall surfaces of the first dielectric layer facing the capacitor holes;

a first conductive filling layer, filled in a region surrounded by the second electrode layer;

a plurality of sub-auxiliary layers separate from each other, the sub-auxiliary layers covering a top surface of the stack structure, and each of the sub-auxiliary layers being at least overlapped with two capacitor holes;

a second dielectric layer, covering sidewall surfaces and top surfaces of the first electric layer away from the capacitor holes as well as surfaces of the sub-auxiliary layers; and a third electrode layer, covering a surface of the second dielectric layer.

Optionally, the stack structure comprises a first support layer, a second support layer and a third support layer, and the first support layer, the second support layer and the third support layer are successively stacked along a direction perpendicular to the substrate; and each of the sub-auxiliary layers covers surfaces of two capacitor holes being overlapped with this sub-auxiliary layer, and covers a surface of the third support layer between two adjacent capacitor holes being overlapped with this sub-auxiliary layer.

Optionally, the third support layer has first openings corresponding to gap regions between two adjacent sub-auxiliary layers, and the first openings have a width greater than a width of the gap regions; and the second support layer has second openings corresponding to the gap regions between two adjacent sub-auxiliary layers.

Optionally, the sub-auxiliary layers have a thickness greater than a thickness of the third support layer.

Optionally, a material of the sub-auxiliary layers is the same as a material of the support layers.

Optionally, the structure further comprises:

a second conductive filling layer, covering a surface of the third electrode layer.

For the double-sided capacitor structure and forming method thereof according to the present disclosure, on one hand, by filling the first conductive filling layer in the region surrounded by the second electrode layer in the capacitor holes, the first electrode layer and the second electrode layer are supported, and the risk of electrode collapse and overturning is reduced or even avoided. On the other hand, by forming a plurality of sub-auxiliary layers for sealing the capacitor holes and allowing each of the sub-auxiliary layers to be overlapped with at least two capacitor holes, the stability of the tops of the first electrode layer and the second electrode layer is improved. Thus, the risk of electrode collapse and overturning is reduced, the overall stability of the double-sided capacitor structure is improved, and it is also conducive to increase the capacitance value of the double-sided capacitor structure.

BRIEF DESCRIPTION OF THE DRAWINGS

FIG. 1 is a flowchart of a method for forming a double-sided capacitor structure in a specific implementation of the present disclosure;

DETAILED DESCRIPTION

Figure 2A:
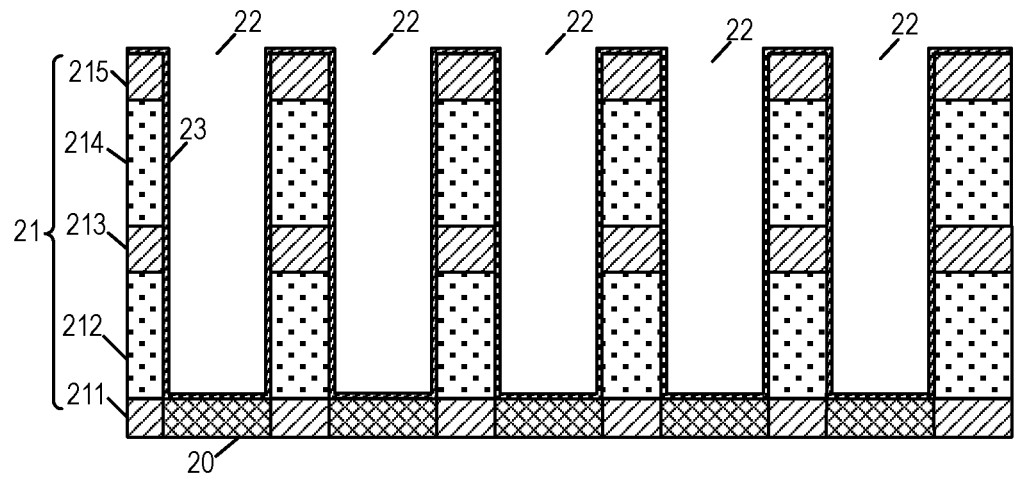
FIG. 2A is a first sectional view of main processes in the process of forming a double-sided capacitor structure in a specific implementation of the present disclosure.

The specific implementations of the double-sided capacitor structure and forming method thereof according to the present disclosure will be described in detail below with reference to the accompanying drawings.

This specific implementation provides a method for forming a double-sided capacitor structure. FIG. 1 is a flowchart of a method for forming a double-sided capacitor structure in the specific implementation of the present invention, and FIGS. 2A-2M are sectional views of main processes in the process of forming a double-sided capacitor structure in the specific implementation of the present invention. The double-sided capacitor structure in this specific implementation can be applied to, but not limited to, DRAM memories. As shown in FIG. 1 and FIGS. 2A-2M, the method for forming a double-sided capacitor structure in this implementation comprises following steps.

S11: A base is provided, the base comprising a substrate, a plurality of capacitor contacts 20 located in the substrate, a stack structure 21 located on the surface of the substrate and a plurality of capacitor holes 22 which run through the stack structure 21 and expose the capacitor contacts 20, the stack structure 21 comprising sacrificial layers and support layers which are stacked alternately in a direction perpendicular to the substrate, as shown in FIG. 2A.

Specifically, there are a plurality of active regions arranged in an array inside the substrate, and the capacitor contacts 20 are located in the active regions. The material of the capacitor contacts 20 may be, but not limited to, tungsten. The plurality of sacrificial layers and the plurality of support layers are stacked alternately in a direction perpendicular to the substrate. The number of the sacrificial layers and the support layers which are stacked alternately may be selected by those skilled in the art according to actual needs. In this specific implementation, in the stack structure, there are at least two support layers and at least one sacrificial layer, in order to improve the lateral stability of the capacitor array region. The material of the sacrificial layers may be, but not limited to, an oxide material, for example, silicon oxide; and, the material of the support layers may be, but not limited to, a nitride material, for example, silicon nitride.

S12: A first electrode layer 23, a first dielectric layer 24 and a second electrode layer 25 which are stacked along a radial direction of the capacitor holes 22 are successively formed on inner walls of the capacitor holes 22.

Figure 2B:
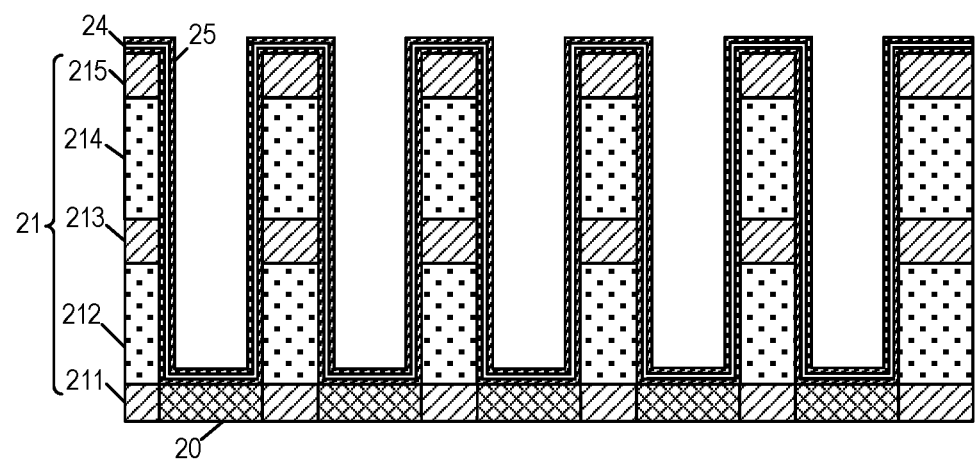
FIG. 2B is a second sectional view of main processes in the process of forming a double-sided capacitor structure in a specific implementation of the present disclosure.

Specifically, after the capacitor holes 22 are formed, titanium nitride or other materials are deposited on the surfaces of inner walls of the capacitor holes 22 and the top surface of the stack structure 21 (i.e., the surface of the stack structure away from the substrate) to form the first electrode layer 23, as shown in FIG. 2A. Then, a dielectric layer material with a high dielectric constant is deposited on the surface of the first electrode layer 23 to form the first dielectric layer 24. Next, titanium nitride or other materials are deposited on the surface of the first dielectric layer 24 to form the second electrode layer 25, as shown in FIG. 2B.

S13: A first conductive material is filled in the capacitor holes 22 to form a first conductive filling layer 26, as shown in FIG. 2D.

Optionally, the first electrode layer 23, the first dielectric layer 24 and the second electrode layer 25 are also successively stacked on the top surface of the stack structure 21, and the specific step of forming a first conductive filling layer 26 comprises:

depositing a first conductive material in the capacitor holes 22 and on the surface of the second electrode layer located on the top surface of the stack structure 21; and removing the first conductive material covering the surface of the second electrode layer 25 on the top surface of the stack structure 21.

Figure 2C:
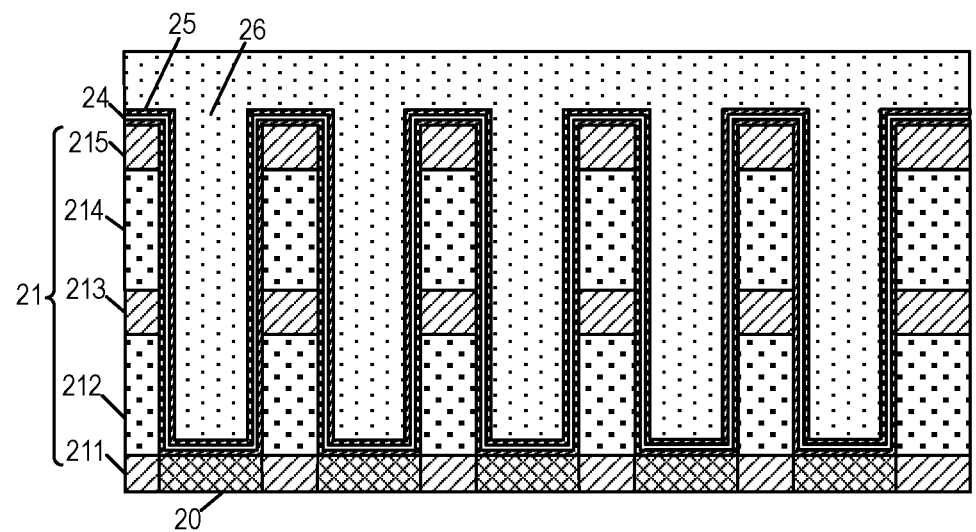
FIG. 2C is a third sectional view of main processes in the process of forming a double-sided capacitor structure in a specific implementation of the present disclosure.
Figure 2D:
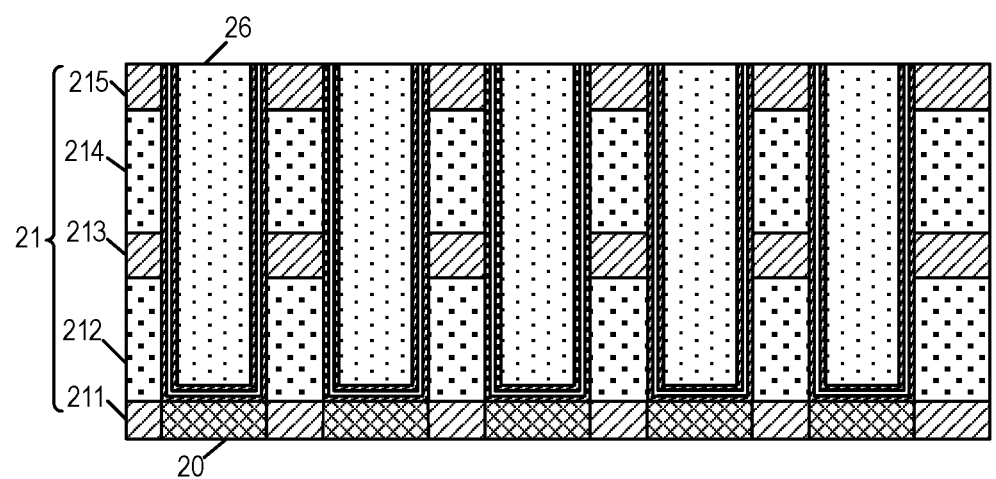
FIG. 2D is a fourth sectional view of main processes in the process of forming a double-sided capacitor structure in a specific implementation of the present disclosure.

Specifically, the first conductive material may be deposited in the capacitors 22 by chemical vapor deposition, physical vapor deposition or atomic latter deposition to fill the capacitor holes 22 (i.e., a region surrounded by the second electrode layer 25 in the capacitor holes 22) and cover the second electrode layer 25 on the surface of the stack structure 21, as shown in FIG. 2C. The first conductive material may be a metal material or a polycrystalline silicon material, which can be selected by those skilled in the art according to actual needs. Subsequently, the first conductive material covering the top surface of the stack structure 21 is removed, and only the first conductive material in the capacitor holes 22 are remained, as shown in FIG. 2D.

Figure 2E:
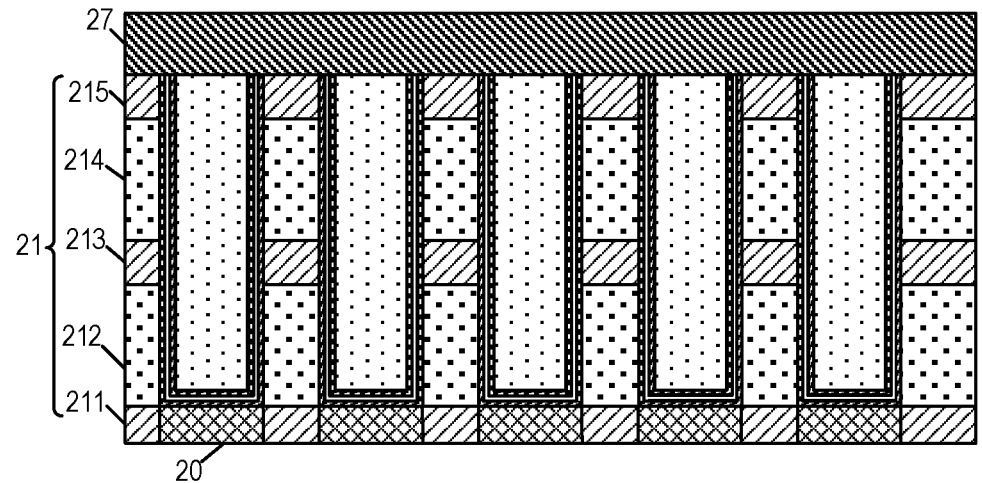
FIG. 2E is a fifth sectional view of main processes in the process of forming a double-sided capacitor structure in a specific implementation of the present disclosure.

S14: An auxiliary layer 27 for sealing the capacitor holes 22 is formed, as shown in FIG. 2E.

Optionally, the specific step of forming an auxiliary layer 27 for sealing the capacitor holes 22 comprises:

removing the first electrode layer 23, the first dielectric layer 24 and the second electrode layer 25 covering the top surface of the stack structure 21; and forming an auxiliary layer 27 which covers the second electrode layer 25 on the top surface of the stack structure 21 and seals the capacitor holes 22.

Specifically, the first electrode layer 23, the first dielectric layer 24 and the second electrode layer 25 covering the top surface of the stack structure as well as a part of the first conductive filling layer 26 in the capacitor holes 22 are removed, so that the top surface of the first electrode layer 23, the top surface of the first dielectric layer 24, the top surface of the second electrode layer 25 and the top surface of the first conductive filling layer 26 are all flush with the top surface of the stack structure 21, as shown in FIG. 2D. Subsequently, an insulating material is deposited on the top surface of the first electrode layer 23, the top surface of the first dielectric layer 24, the top surface of the second electrode layer 25, the top surface of the first conductive filling layer 26 and the top surface of the stack structure 21 by chemical vapor deposition, physical vapor deposition or atomic latter deposition, as shown in FIG. 2E.

In order to simplify the subsequent etching process, optionally, the material of the auxiliary layer 27 is the same as that of the support layers.

The specific thickness of the auxiliary layer 27 may be set by those skilled in the art according to actual needs. In this specific implementation, in order to further enhance the lateral supporting effect on the tops of the first electrode layer 23, the first dielectric layer 24 and the second electrode layer 25, optionally, the auxiliary layer 27 has a thickness greater than that of any support layer in the stack structure 21; or, the auxiliary layer 27 has a thickness greater than that of the support layer on the top of the stack structure 21 (i.e., the uppermost support layer in the stack structure 21).

Figure 2F:
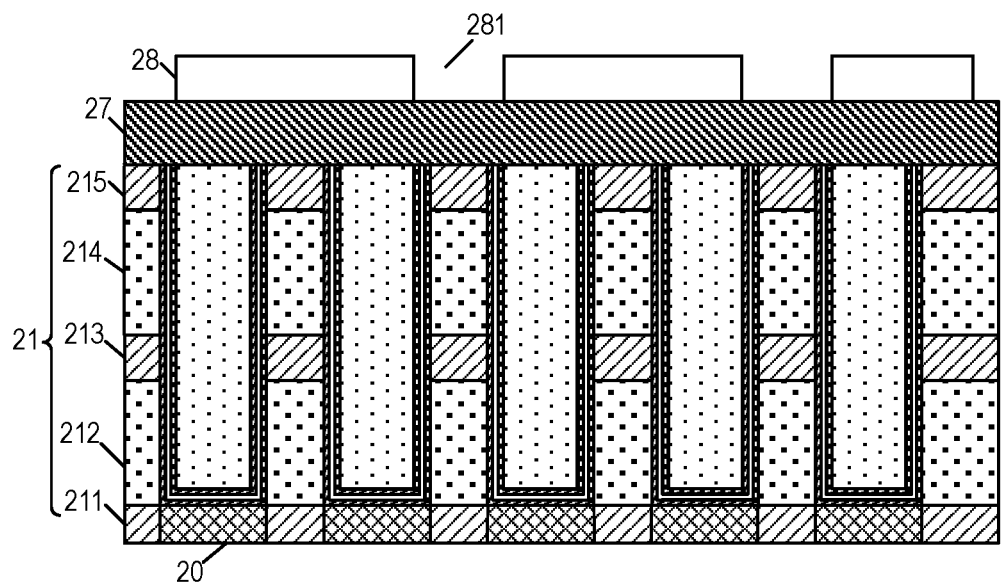
FIG. 2F is a sixth sectional view of main processes in the process of forming a double-sided capacitor structure in a specific implementation of the present disclosure.
Figure 2G:
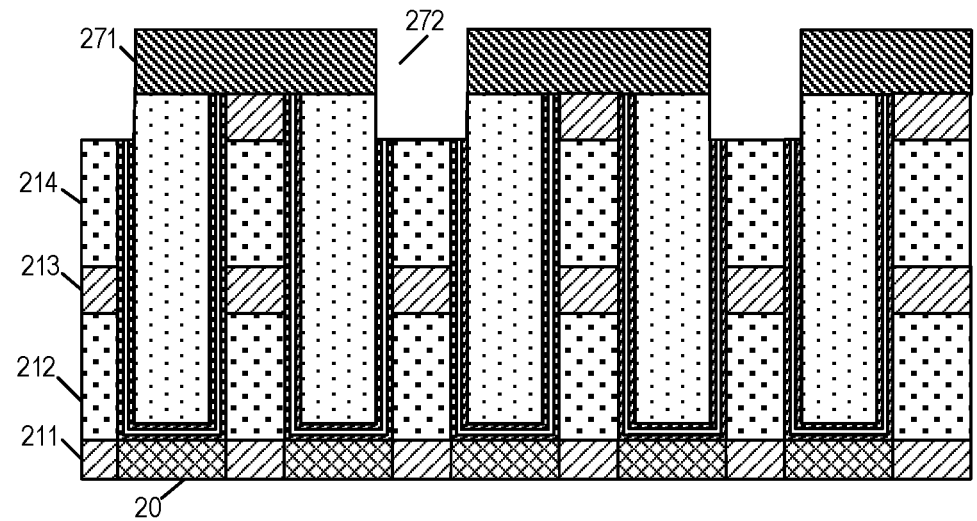
FIG. 2G is a seventh sectional view of main processes in the process of forming a double-sided capacitor structure in a specific implementation of the present disclosure.
Figure 2H:
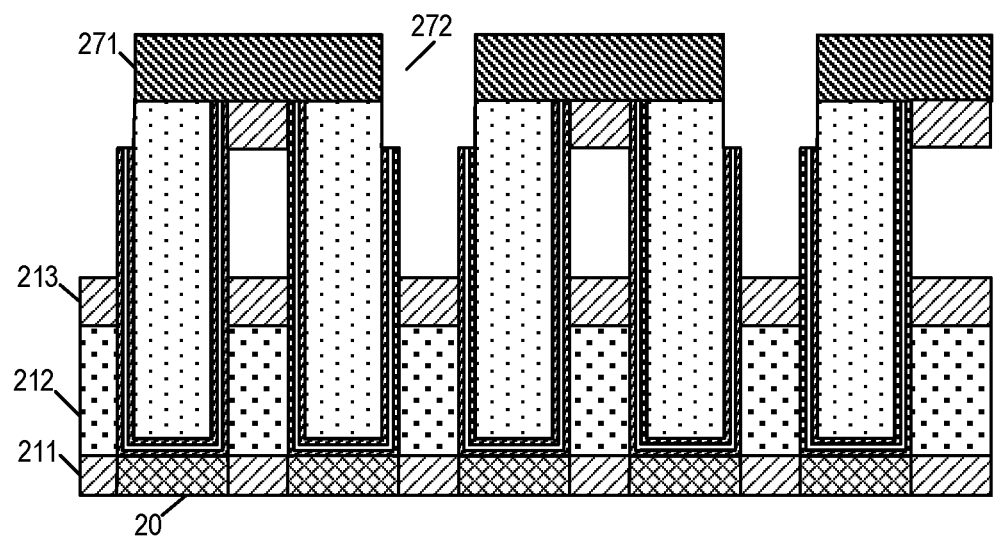
FIG. 2H is an eighth sectional view of main processes in the process of forming a double-sided capacitor structure in a specific implementation of the present disclosure.
Figure 2I:
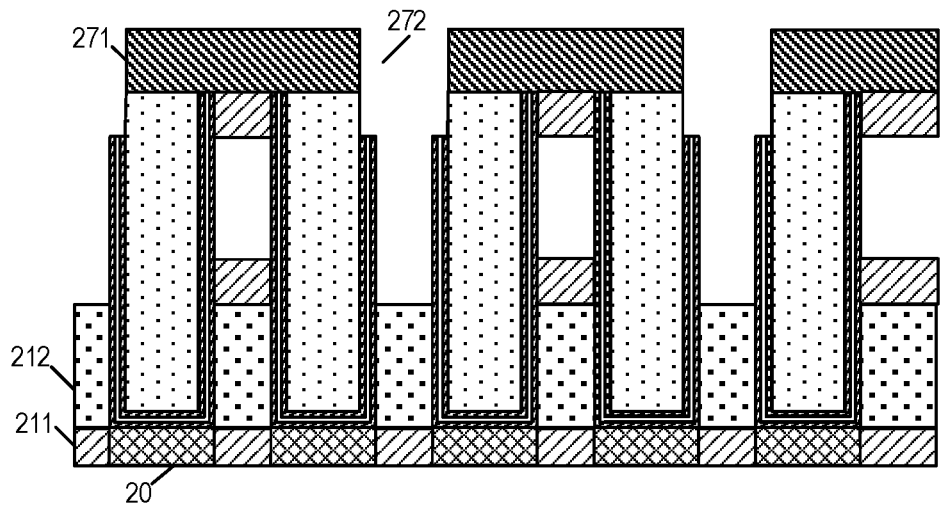
FIG. 2I is a ninth sectional view of main processes in the process of forming a double-sided capacitor structure in a specific implementation of the present disclosure.
Figure 2J:
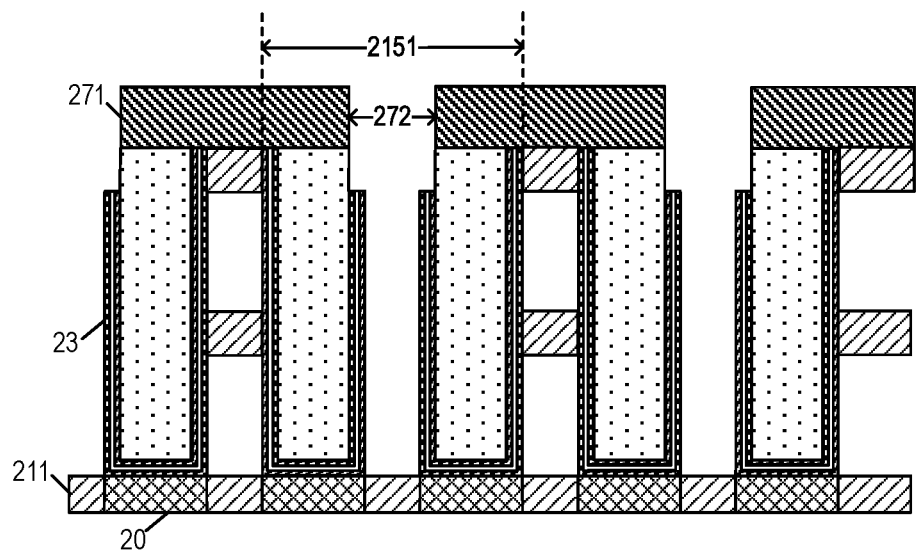
FIG. 2J is a tenth sectional view of main processes in the process of forming a double-sided capacitor structure in a specific implementation of the present disclosure.

S15: A part of the auxiliary layer 27 and several of the support layers and the sacrificial layers are removed to expose the first electrode layer 23, the remaining of the auxiliary layer 27 being divided into a plurality of sub-auxiliary layers 271, each of which being at least overlapped with two capacitor holes 22, as shown in FIG. 2J.

Optionally, the stack structure 21 comprises a first support layer 211, a first sacrificial layer 212, a second support layer 213, a second sacrificial layer 214 and a third support layer 215 which are successively stacked along a direction perpendicular to the substrate; and, the specific step of removing a part of the auxiliary layer 27 and several of the support layers and the sacrificial layers comprises:

forming a photoresist layer 28 covering the auxiliary layer 27, the photoresist layer 28 having an etching window 281 for exposing the auxiliary layer 27; and successively etching the auxiliary layer 27, the third support layer 215, the second sacrificial layer 214, the second support layer 213 and the first sacrificial layer 212 along the etching window 281, so that the remaining of the auxiliary layer 27 is divided into a plurality of sub-auxiliary layers 271, each of which is overlapped with two capacitor holes 22.

The following description will be given by taking the auxiliary 27 and the third support layers 215 being made of the same material (e.g., silicon nitride) as an example.

Firstly, the photoresist layer 28 covering the auxiliary layer 27 is formed. The photoresist layer 28 has an etching window 281 for exposing the auxiliary layer 27. The position of the etching window 282 corresponds to a gap between two adjacent capacitor holes 22, as shown in FIG. 2F. Then, a part of the auxiliary layer 27 and the third support layer 215 are etched by using the second sacrificial layer 214 as an etching stop layer, to obtain a structure shown in FIG. 2G. By etching in this step, the continuous auxiliary layer 27 is divided into a plurality of sub-auxiliary layers 271 independent of each other. Two adjacent sub-auxiliary layers 271 are separated from each other by a gap region 272, and each of the sub-auxiliary layers 271 continuously covers two adjacent capacitor holes. During the etching process in this step, it is also possible to parts of the first electrode layer 23, the first dielectric layer 24 and the second electrode layer 25 on one side of the capacitor holes 22 to expose a part of the first conductive filling layer 26, so that the top surfaces of the first electrode layer 23, the second dielectric layer 24 and the second electrode layer 25 remaining after etching are flush with the top surface of the second sacrificial layer 214. During practical operations, for those skilled in the art, the first electrode layer 23, the first dielectric layer 24 and the second electrode layer 25 may not be etched by adjusting the position of the etching window 281. Next, the photoresist 28 is removed, and the second sacrificial layer 214 is removed by hydrofluoric acid or other acidic solutions to expose the second support layer 213, as shown in FIG. 2H. Then, a part of the second support layer 213 is etched along the gap region 272 to expose the first sacrificial layer 212, as shown in FIG. 2I. Subsequently, the first sacrificial layer 212 is removed by hydrofluoric acid or other acidic solutions to expose the first support layer 211 and the surface of the first electrode layer 23 away from the capacitor holes 22, as shown in FIG. 2J.

During the etching process in this step, on one hand, since the first conductive filling layer 26 has been filled in the capacitor holes 22, the stability of the first electrode layer 23, the first dielectric layer 24 and the second electrode layer 25 is improved, and the first electrode layer 23, the first dielectric layer 24 and the second electrode layer 5 are prevented from collapsing or overturning. On the other hand, the top surfaces of the first electrode layer 23, the first dielectric layer 24 and the second electrode layer 25 are covered by the sub-auxiliary layers 271, the stability of the tops of the first electrode layer 23, the first dielectric layer 24 and the second electrode layer 25 is improved, and the occurrence of electrode collapse or overturning is further avoided.

S16: A second dielectric layer 29 covering the surface of the first electrode layer 23 and the surfaces of the sub-auxiliary layers 271 and a third electrode layer 30 covering the surface of the second dielectric layer 29 are formed so as to form a double-sided capacitor structure.

Figure 2K:
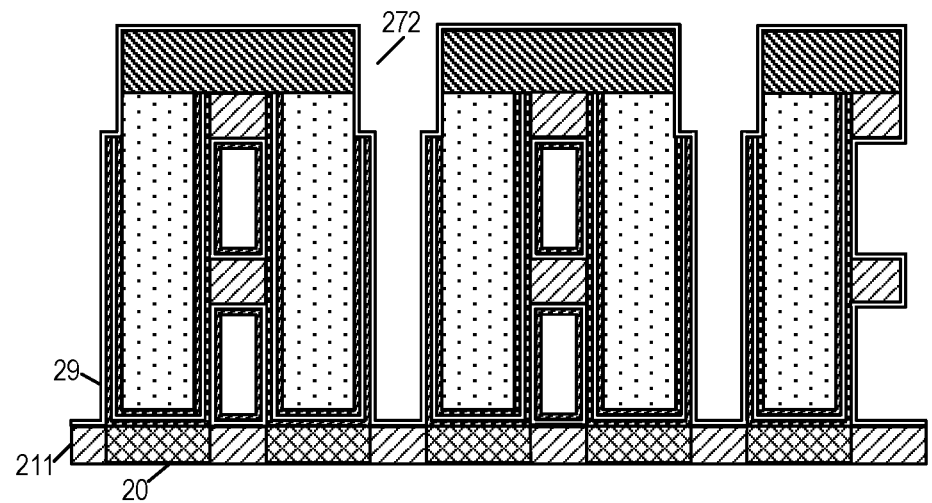
FIG. 2K is an eleventh sectional view of main processes in the process of forming a double-sided capacitor structure in a specific implementation of the present disclosure.
Figure 2L:
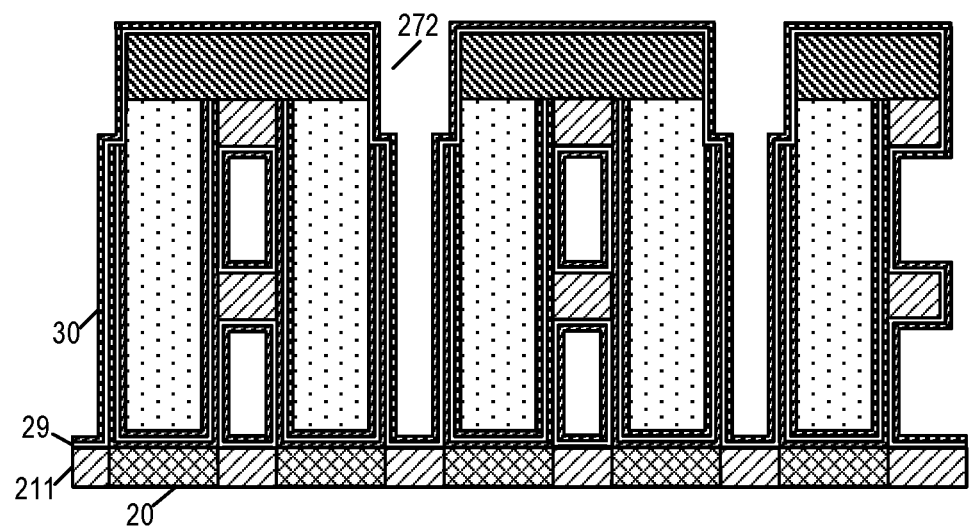
FIG. 2L is a twelfth sectional view of main processes in the process of forming a double-sided capacitor structure in a specific implementation of the present disclosure.

Specifically, a dielectric material with a high dielectric constant is deposited on the exposed surface of the first support layer 211, the surface of the first electrode layer 23 away from the capacitor holes 22, the top surface of the first electrode layer 23, the surface of the first dielectric layer 24, the surface of the second electrode layer 25 and the surfaces of the sub-auxiliary layers 271, to form the second dielectric layer 29, as shown in FIG. 2K. Subsequently, titanium nitride or other conductive materials are deposited on the surface of the second dielectric layer 29 to form the third electrode layer 30, as shown in FIG. 2L. The material of the second dielectric layer 29 may be the same as or different from that of the first dielectric layer 24, which may be selected by those skilled in the art according to actual needs.

Figure 2M:
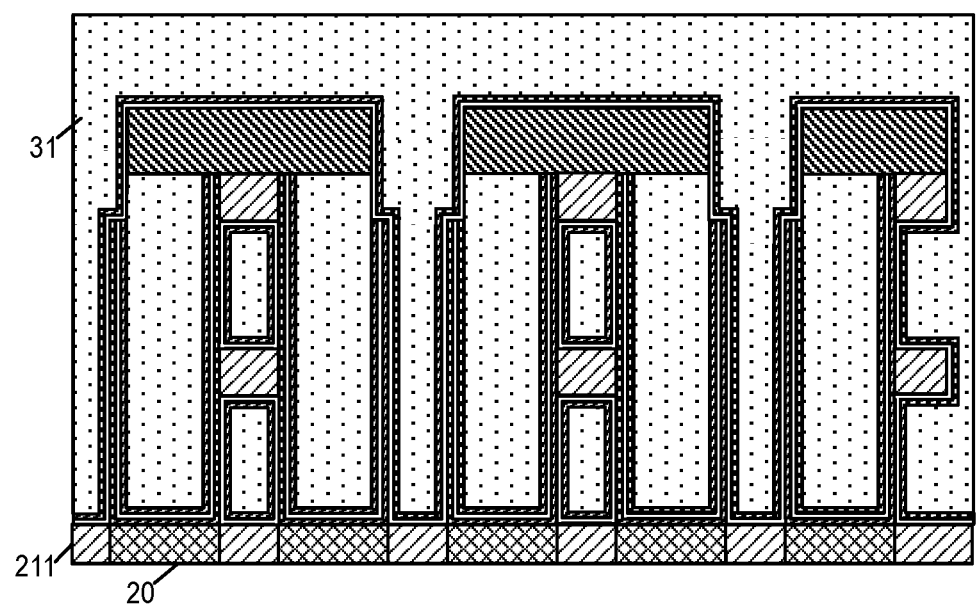
FIG. 2M is a thirteenth sectional view of main processes in the process of forming a double-sided capacitor structure in a specific implementation of the present disclosure.

Optionally, after forming a double-sided capacitor structure, the method further comprises following steps:

depositing a second conductive material on the surface of the third electrode layer 30 to form a second conductive filling layer 31, as shown in FIG. 2M.

Specifically, a second conductive material is deposited on the surface of the third electrode layer 30, and the formed second conductive filling layer 31 fills gaps formed after removing the third support layer 215, the second sacrificial layer 214, the second support layer 213, the first sacrificial layer 212 and a part of the auxiliary layer, so that the stability of the double-sided capacitor structure is further improved. The material of the second conductive filling layer 31 may be the same as that of the first conductive filling layer 26, for example, a polycrystalline silicon material.

Moreover, this specific implementation further provides a double-sided capacitor structure. The double-sided capacitor structure in this specific implementation may be formed by the method shown in FIGS. 1 and 2A-2M. The schematic diagram of the double-sided capacitor structure in this specific implementation may refer to FIG. 2M. As shown in FIGS. 2A-2M, the double-sided capacitor structure in this specific implementation comprises:

a base, the base comprising a substrate, a plurality of capacitor contacts 20 located in the substrate, a stack structure 21 located on the surface of the substrate and a plurality of capacitor holes 22 which run through the stack structure 21 and expose the capacitor contacts 20, the stack structure 21 at least comprising a plurality of support layers which are stacked along a direction perpendicular to the substrate;

a first electrode layer 23, covering inner walls of the capacitor holes 22;

a first dielectric layer 24, covering sidewall surfaces and bottom wall surfaces of the first electrode layer 23 facing the capacitor holes 22;

a second electrode layer 25, covering sidewall surfaces and bottom wall surfaces of the first dielectric layer 24 facing the capacitor holes 22;

a first conductive filling layer 26, filled in a region surrounded by the second electrode layer 25;

a plurality of sub-auxiliary layers 271 separate from each other, the sub-auxiliary layers 271 covering the top surface of the stack structure 21, and each of the sub-auxiliary layers 271 being at least overlapped with two capacitor holes 22;

a second dielectric layer 29, covering sidewall surfaces and bottom wall surfaces of the first electric layer 23 away from the capacitor holes 22 as well as the surfaces of the sub-auxiliary layers 271; and a third electrode layer 30, covering the surface of the second dielectric layer 29.

In this specific implementation, each of the sub-auxiliary layers 271 continuously covers two adjacent capacitor holes 22. There is a height difference between two sides of the first electrode layer 23 located in the same capacitor hole 22 in the radial direction of the capacitor hole 22. The height of one side of the first electrode layer 23 directly contacting the sub-auxiliary layer 271 is greater than that of the other side. That is, the top surface of one side of the first electrode layer 23 directly contacting the sub-auxiliary layer 271 is located above the top surface of the other side. In other specific implementations, for those skilled in the art, two sides of the first electrode layer 23 located on the same capacitor hole 22 in the radial direction of the capacitor hole 22 may also be the same in height by adjusting the manufacturing process.

Optionally, the stack structure 21 comprises a first support layer 211, a second support layer 213 and a third support layer 215 which are successively stacked along a direction perpendicular to the substrate; and Each of the sub-auxiliary layers 271 covers the surfaces of two capacitor holes 22 that are overlapped with this sub-auxiliary layer, and covers the surface of the third support layer 215 between two adjacent capacitor holes 22 that are overlapped with this sub-auxiliary layer.

Optionally, the third support layer 215 has first openings 2151 corresponding to gap regions 272 between two adjacent sub-auxiliary layers 271, and the first openings 2151 have a width greater than that of the gap regions 272; and the second support layer 213 has second openings corresponding to the gap regions 272 between two adjacent sub-auxiliary layers 271.

Specifically, referring to FIG. 2J, the first openings 2151 have a width greater than that of the gap regions 272, that is, the third support layer 215 will not extent out from the gap regions 272 between two adjacent sub-auxiliary layers 271. In this specific implementation, the second openings in the second support layer 213 have the same width as the first openings 2151, that is, the second support layer 213 will not protrude from the sub-auxiliary layers 271 in a horizontal direction. By defining the relationship between the gap regions 272 and the first openings 2151 and the second openings, on one hand, it is conductive to completely remove the second sacrificial layer 214 and the first sacrificial layer 212 in the manufacturing process. On the other hand, it is also conductive to further increase the height of the third electrode layer 30 and further increase the capacitance value of the capacitor.

In order to further improve the stability of the top of each electrode layer, optionally, the sub-auxiliary layers 271 each have a thickness greater than that of the third support layer 215.

In other specific implementations, those skilled in the art can set the thickness of each of the sub-auxiliary layers 271 to be equal to the thickness of the third support layer 215 according to actual needs.

Optionally, the material of the sub-auxiliary layers 271 is the same as that of the support layers. For example, the both materials are a nitride material (e.g., silicon nitride) to simplify the manufacturing process.

Optionally, the double-sided capacitor structure further comprises:

a second conductive filling layer 31, covering the surface of the third electrode layer 30.

The second conductive filling layer 31 fills the gap regions 272, the first openings and the second openings. The material of the second conductive filling layer 31 may be the same as that of the first conductive filling layer 26, for example, a polycrystalline silicon material.

For the double-sided capacitor structure and forming method thereof in this specific implementation, on one hand, by filling the first conductive filling layer in the region surrounded by the second electrode layer in the capacitor holes, the first electrode layer and the second electrode layer are supported, and the risk of electrode collapse and overturning is reduced or even avoided; on the other hand, by forming a plurality of sub-auxiliary layers for sealing the capacitor holes and allowing each of the sub-auxiliary layers to be overlapped with at least two capacitor holes, the stability of the tops of the first electrode layer and the second electrode layer is improved. Thus, the risk of electrode collapse and overturning is reduced, the overall stability of the double-sided capacitor structure is improved, and it is also conducive to increase the capacitance value of the double-sided capacitor structure.

The above description merely shows the preferred implementations of the present disclosure. It should be noted that for a person of ordinary skill in the art, various improvements and modifications may be made without departing from the principle of the present disclosure, and those improvements and modifications shall also be regarded as falling into the protection scope of the present disclosure.

What is claimed is:

1. A method for forming a double-sided capacitor structure, comprising:
   providing a base, the base comprising a substrate, a plurality of capacitor contacts located in the substrate, a stack structure located on a surface of the substrate and a plurality of capacitor holes running through the stack structure and exposing the capacitor contacts, the stack structure comprising sacrificial layers and support layers, the sacrificial layers and the support layers stacked alternately in a direction perpendicular to the substrate;
   successively forming, on inner walls of the capacitor holes, a first electrode layer, a first dielectric layer and a second electrode layer stacked along a radial direction of the capacitor holes;
   filling a first conductive material in the capacitor holes to form a first conductive filling layer;
   forming an auxiliary layer for sealing the capacitor holes;
   removing a part of the auxiliary layer and several of the support layers and the sacrificial layers to expose the first electrode layer, a remaining of the auxiliary layer being divided into a plurality of sub-auxiliary layers, each of the sub-auxiliary layers being at least overlapped with two capacitor holes; and
   forming a second dielectric layer covering a surface of the first electrode layer and surfaces of the sub-auxiliary layers and a third electrode layer covering a surface of the second dielectric layer to form a double-sided capacitor structure.

2. The method according to claim 1, wherein the first electrode layer, the first dielectric layer and the second electrode layer are also successively stacked on a top surface of the stack structure, and the forming a first conductive filling layer comprises:
   depositing the first conductive material in the capacitor holes and on a surface of the second electrode layer located on the top surface of the stack structure; and
   removing the first conductive material covering the surface of the second electrode layer on the top surface of the stack structure.

3. The method according to claim 2, wherein the forming an auxiliary layer for sealing the capacitor holes comprises:
   removing the first electrode layer, the first dielectric layer and the second electrode layer covering the top surface of the stack structure; and
   forming an auxiliary layer covering the second electrode layer on the top surface of the stack structure and sealing the capacitor holes.

4. The method according to claim 1, wherein the stack structure comprises a first support layer, a first sacrificial layer, a second support layer, a second sacrificial layer and a third support layer successively stacked along a direction perpendicular to the substrate; and, the removing a part of the auxiliary layer and several of the support layers and the sacrificial layers comprises:

forming a photoresist layer covering the auxiliary layer, the photoresist layer having an etching window for exposing the auxiliary layer; and successively etching the auxiliary layer, the third support layer, the second sacrificial layer, the second support layer and the first sacrificial layer along the etching window, so that a remaining of the auxiliary layer is divided into a plurality of sub-auxiliary layers, each of the sub-auxiliary layers being overlapped with two capacitor holes.

5. The method according to claim 1, wherein a material of the auxiliary layer is the same as a material of the support layers.

6. The method according to claim 1, after forming a double-sided capacitor structure, the method further comprises:

depositing a second conductive material on a surface of the third electrode layer to form a second conductive filling layer.

7. A double-sided capacitor structure, comprising:

a base, the base comprising a substrate, a plurality of capacitor contacts located in the substrate, a stack structure located on a surface of the substrate and a plurality of capacitor holes running through the stack structure and exposing the capacitor contacts, the stack structure at least comprising a plurality of support layers stacked along a direction perpendicular to the substrate;

a first electrode layer, covering inner walls of the capacitor holes;

a first dielectric layer, covering sidewall surfaces and bottom wall surfaces of the first electrode layer facing the capacitor holes;

a second electrode layer, covering sidewall surfaces and bottom wall surfaces of the first dielectric layer facing the capacitor holes;

a first conductive filling layer, filled in a region surrounded by the second electrode layer;

a plurality of sub-auxiliary layers separate from each other, the sub-auxiliary layers covering a top surface of the stack structure, and each of the sub-auxiliary layers being at least overlapped with two capacitor holes;

a second dielectric layer, covering sidewall surfaces and top surfaces of the first electrode layer away from the capacitor holes as well as surfaces of the sub-auxiliary layers; and a third electrode layer, covering a surface of the second dielectric layer.

8. The structure according to claim 7, wherein the stack structure comprises a first support layer, a second support layer and a third support layer, and the first support layer, the second support layer and the third support layer are successively stacked along a direction perpendicular to the substrate; and each of the sub-auxiliary layers covers surfaces of two capacitor holes being overlapped with this sub-auxiliary layer, and covers a surface of the third support layer between two adjacent capacitor holes being overlapped with this sub-auxiliary layer.

9. The structure according to claim 8, wherein the third support layer has first openings corresponding to gap regions between two adjacent sub-auxiliary layers, and the first openings have a width greater than a width of the gap regions; and the second support layer has second openings corresponding to the gap regions between two adjacent sub-auxiliary layers.

10. The structure according to claim 8, wherein the sub-auxiliary layers have a thickness greater than a thickness of the third support layer.

11. The structure according to claim 7, wherein a material of the sub-auxiliary layers is the same as a material of the support layers.

12. The structure according to claim 7, further comprising:

a second conductive filling layer, covering a surface of the third electrode layer.

* * * * *